(12) United States Patent
Hall et al.

(10) Patent No.: US 7,879,663 B2
(45) Date of Patent: Feb. 1, 2011

(54) TRENCH FORMATION IN A SEMICONDUCTOR MATERIAL

(75) Inventors: Mark D. Hall, Austin, TX (US); Glenn C. Abeln, Austin, TX (US); John M. Grant, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 640 days.

(21) Appl. No.: 11/683,846

(22) Filed: Mar. 8, 2007

(65) Prior Publication Data

US 2008/0217705 A1    Sep. 11, 2008

(51) Int. Cl.
*H01L 21/00* (2006.01)
*H01L 21/84* (2006.01)

(52) U.S. Cl. .................... 438/164; 257/E21.564
(58) Field of Classification Search .................. 438/284, 438/286, 296, 197, 424, 154, 149, 151, 153, 438/155, 157, 164, 201, 400; 257/E21.703, 257/E21.564, E21.628
See application file for complete search history.

(56) References Cited

U.S. PATENT DOCUMENTS

| | | | |
|---|---|---|---|
| 4,789,648 A | 12/1988 | Chow et al. | |
| 4,988,643 A | 1/1991 | Tsou | |
| 5,019,879 A | 5/1991 | Chiu | |
| 5,021,848 A | 6/1991 | Chiu | |
| 5,496,771 A | 3/1996 | Cronin et al. | |
| 5,523,258 A | 6/1996 | Petti et al. | |
| 5,918,131 A | 6/1999 | Hsu et al. | |
| 6,359,305 B1 | 3/2002 | Chiu | |
| 6,624,043 B2 * | 9/2003 | Hsu | 438/424 |
| 6,858,514 B2 | 2/2005 | Hsu et al. | |
| 7,018,873 B2 * | 3/2006 | Dennard et al. | 438/149 |
| 7,141,476 B2 * | 11/2006 | Dao | 438/283 |
| 7,402,466 B2 * | 7/2008 | Chan et al. | 438/149 |
| 7,470,573 B2 * | 12/2008 | Lee et al. | 438/154 |
| 2005/0042867 A1 * | 2/2005 | Sanchez et al. | 438/684 |

(Continued)

FOREIGN PATENT DOCUMENTS

EP    0683514 A1    11/1995

(Continued)

OTHER PUBLICATIONS

Aritome et al; "A 0.67um2 Self-Aligned Shallow Trench Isolation Cell (SA-STI Cell) for 3V-only 256mbit NAND EEPROMs"; IEDM, 1994.

(Continued)

*Primary Examiner*—Matthew C Landau
*Assistant Examiner*—Latanya Crawford
(74) *Attorney, Agent, or Firm*—Susan C. Hill; James L. Clingan, Jr.

(57) ABSTRACT

A semiconductor device is formed on a semiconductor layer. A gate dielectric layer is formed over the semiconductor layer. A layer of gate material is formed over the gate dielectric layer. The layer of gate material is patterned to form a gate structure. Using the gate structure as a mask, an implant into the semiconductor layer is performed. To form a first patterned gate structure and a trench in the semiconductor layer surrounding a first portion and a second portion of the semiconductor layer and the gate, an etch through the gate structure and the semiconductor layer is performed. The trench is filled with insulating material.

19 Claims, 14 Drawing Sheets

U.S. PATENT DOCUMENTS

| | | | |
|---|---|---|---|
| 2006/0231873 A1* | 10/2006 | Anderson et al. | 257/288 |
| 2006/0234434 A1* | 10/2006 | Filipiak | 438/197 |
| 2006/0258110 A1* | 11/2006 | Pelella | 438/311 |
| 2007/0010051 A1* | 1/2007 | Wu et al. | 438/197 |
| 2007/0132011 A1* | 6/2007 | Kato | 257/324 |
| 2008/0138941 A1* | 6/2008 | Pelella | 438/154 |
| 2008/0179678 A1* | 7/2008 | Dyer et al. | 257/351 |
| 2008/0217665 A1* | 9/2008 | Chen et al. | 257/288 |

FOREIGN PATENT DOCUMENTS

| | | |
|---|---|---|
| KR | 10-0196018 B1 | 2/1999 |
| KR | 10-2000-0074841 A | 12/2000 |
| KR | 10-2002-0042312 A | 6/2002 |
| KR | 10-2003-0055997 A | 7/2003 |
| KR | 10-2004-0059427 A | 7/2004 |
| KR | 10-2006-0108333 A | 10/2006 |

OTHER PUBLICATIONS

Imamiya et al; "A 130-mm2, 256-Mbit NAND Flash with Shallow Trench isolation Technology"; 1999 IEEE Journal of Solid-State Circuits, vol. 34, No. 11.

PCT Search report and Written Opinion for corresponding PCT Application No. PCT/US08/53133 mailed Jul. 3, 2008.

\* cited by examiner

TRENCH FORMATION IN A SEMICONDUCTOR MATERIAL

BACKGROUND

1. Field

This disclosure relates generally to a semiconductor device, and more specifically, to trench formation in a semiconductor material.

2. Related Art

Minimizing the layout area required by one or semiconductor devices is important in reducing the cost of an integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
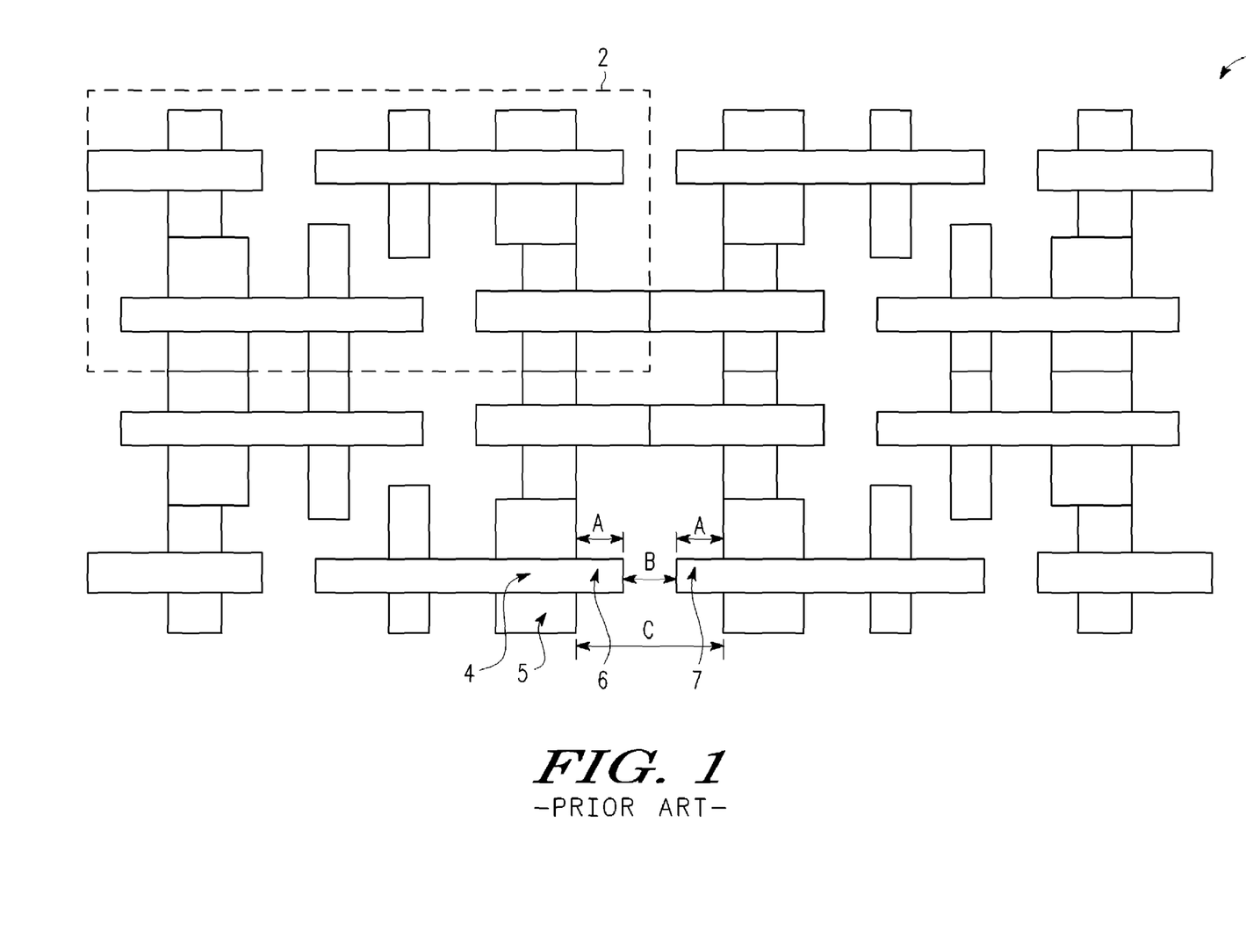
FIG. 1 illustrates, in a top view, a circuit 1 in accordance with the prior art.

Prior art FIG. 1 illustrates a prior art six transistor bitcell static random access memory (SRAM) circuit 1 having a 2×2 array of bitcells (e.g. bitcell 2). As illustrated in prior art FIG. 1, transistor layouts typically require the gate layer 4 to be drawn with a nonzero extension or endcap 6 extending over the edge of the transistor active region 5 in order to allow for overlay misalignment and process variation in active area critical dimensions. However, this results in an increase in the layout area required for some circuits. For example, in circuit 1 illustrated in prior art FIG. 1, the minimum of dimension C is dictated by the minimum of both dimensions A and B. Dimension A is the minimum gate overlap required to extend past active area (i.e. the length of the endcap). Dimension B is the minimum separation that can be patterned between the ends of two endcaps (e.g. between endcap 6 and endcap 7). In the illustrated embodiment, the minimum of dimension B is determined by the available processing technology. The dimension C is the distance between the active area of two separate semiconductor devices. In FIG. 1 (prior art), the minimum of dimension C is determined by the minimum of both dimensions A and B. It would be possible to reduce the dimension C (i.e. the distance between the active area of two separate semiconductor devices) if C was not determined by dimensions A and B.

Figure 2:
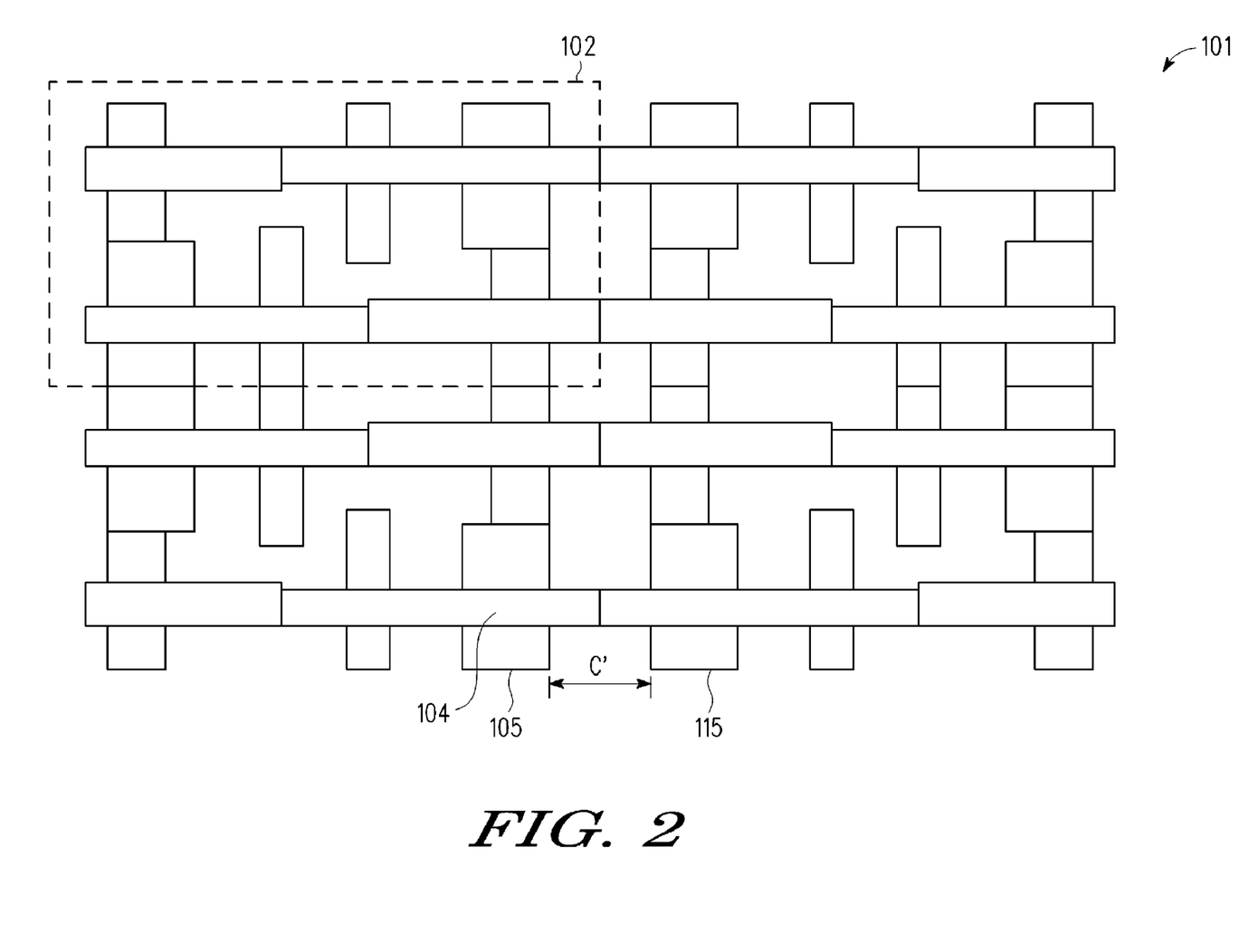
FIG. 2 illustrates, in a top view, a circuit 101 in accordance with one embodiment of the present invention.

FIG. 2 illustrates a six transistor bitcell static random access memory (SRAM) circuit 101 having a 2×2 array of bitcells (e.g. bitcell 102). By forming the semiconductor devices (e.g. transistors) before forming the isolation trenches, it is possible to eliminate the endcaps (6 and 7 of FIG. 1). In other words, the dimension A of FIG. 1 (prior art) may be reduced to zero in the circuit 101 of FIG. 2. The dimension C is now the same as B. And the minimum dimension of C is determined by the available processing technology.

Figure 3:
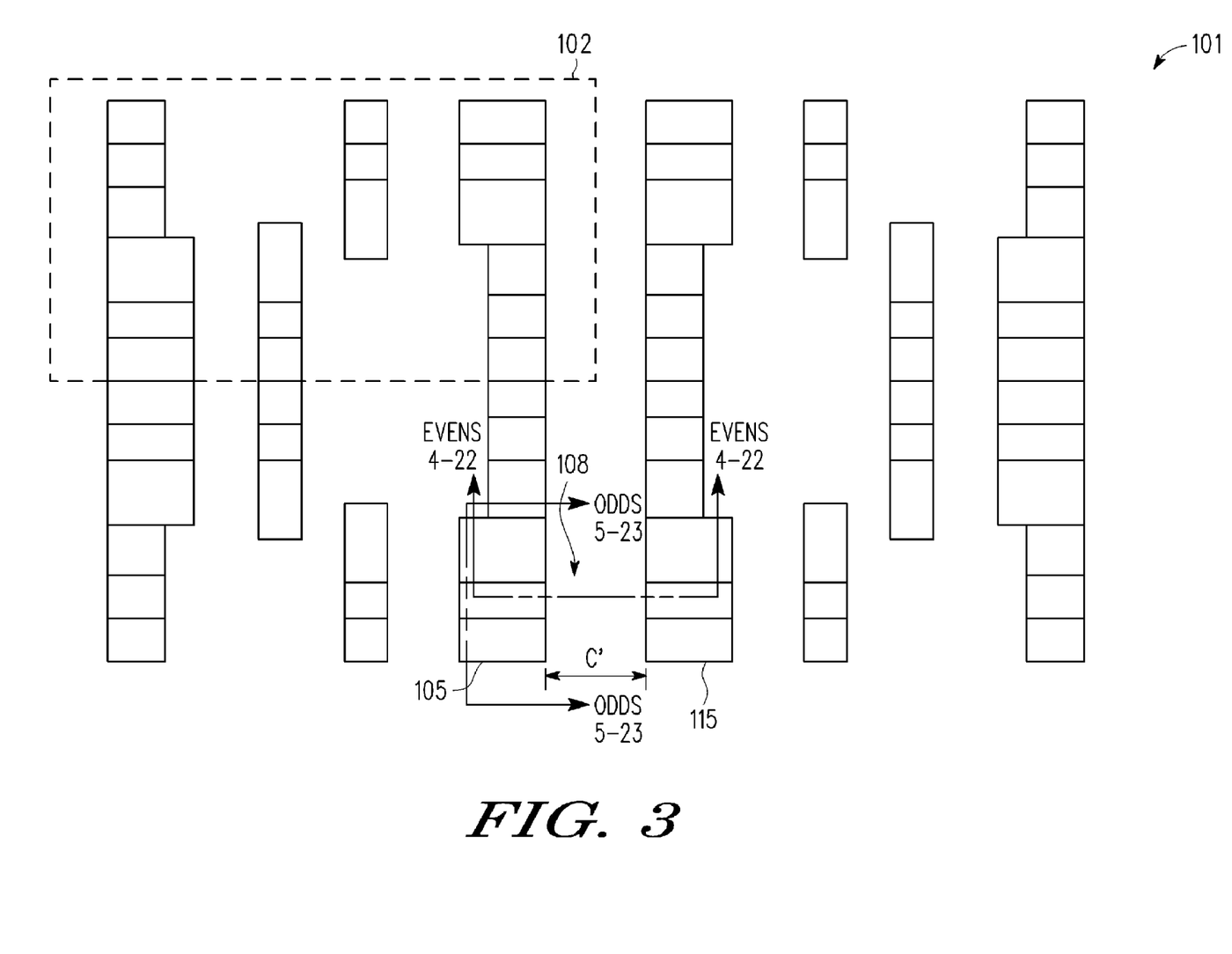
FIG. 3 illustrates, in a top view, a circuit 101 in accordance with one embodiment of the present invention.

FIG. 3 illustrates the SRAM circuit 101 of FIG. 2 after trenches (e.g. 108) have been formed. As a result of forming the trenches (e.g. 108), the gate (e.g. 104) may be made coterminous with the active area (e.g. 105). Coterminous as used herein is defined in such a manner that the gate (e.g. 104) and the active area (e.g. 105) end at the same vertical plane, or at approximately the same vertical plane, when the trench 108 having width C' is formed between the active areas 105 and 115. Note that the area required for each six transistor bitcell 102 (see FIGS. 2 and 3) has been reduced from the area required for bitcell 2 (see FIG. 1). Reducing the area of each bitcell in an SRAM can produce a very significant reduction in semiconductor die size, thus significantly reducing the cost of an integrated circuit. Although the circuit 101 illustrated in FIGS. 2-3 was an SRAM circuit, the present invention is applicable to any type of circuit.

Note that the even figures from FIG. 4-24 are cross-sectional views taken along the cut line illustrated in FIG. 3 which illustrates a plane that is perpendicular to the direction of transistor current flow. Note that the odd figures from FIG. 5-25 are cross-sectional views taken along the cut line illustrated in FIG. 3 which illustrates a plane that is parallel to the direction of transistor current flow.

Figure 4:
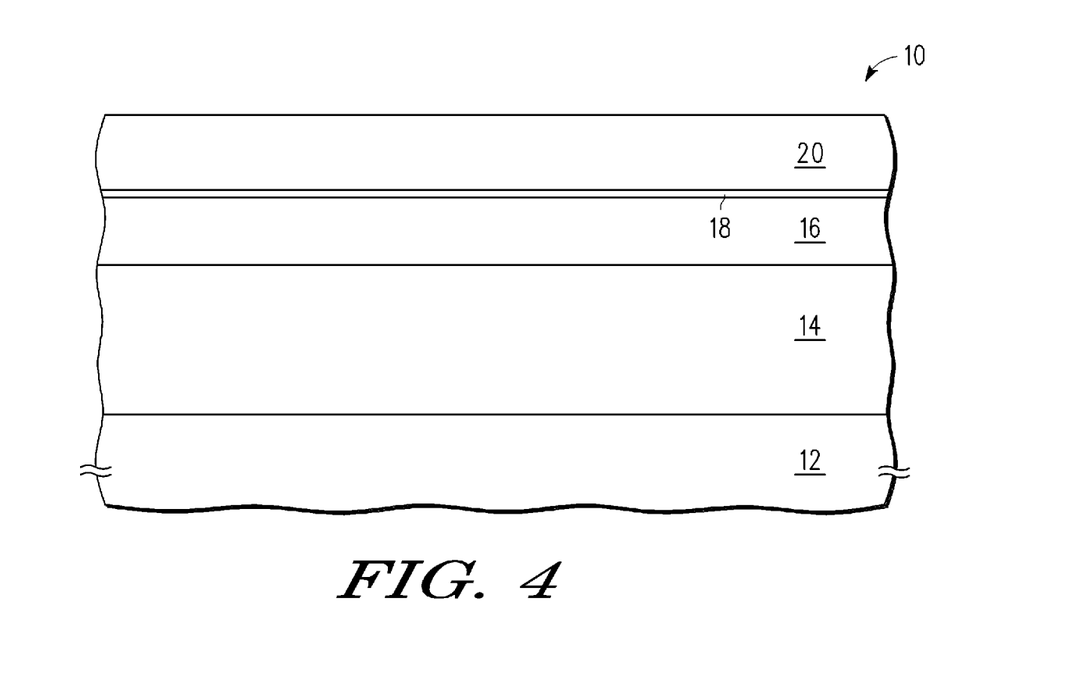
FIGS. 4-25 illustrate, in cross-sectional views, a semiconductor device 10 in accordance with one embodiment of the present invention. Note that the even figures from 4-24 use the same cut line (see FIG. 3), while the odd figures from 5-25 use a different cut line (see FIG. 3).
Figure 5:
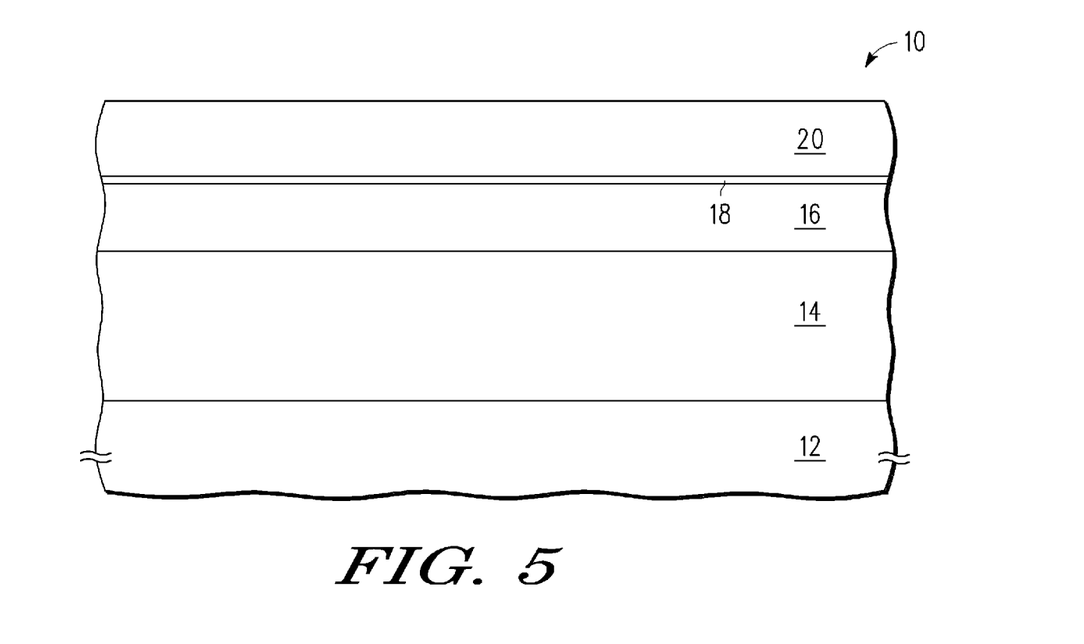

FIGS. 4 and 5 illustrate, in two different cross-sectional views (see FIG. 3 for cut lines), a semiconductor device 10 in accordance with one embodiment of the present invention. In the illustrated embodiment, device 10 includes an SOI (semiconductor on insulator) wafer comprising substrate 12, with an insulating layer 14 overlying substrate 12, and a semiconductor layer 16 overlying insulating layer 14. Gate dielectric layer 18 is comprised of a dielectric material and is formed overlying semiconductor layer 16. Gate dielectric layer 18 may be grown, deposited, or formed using any other appropriate technique. Gate layer 20 is comprised of a conducting material and is formed overlying gate dielectric layer 18. Gate layer 20 may be deposited or formed using any other appropriate technique.

Figure 6:
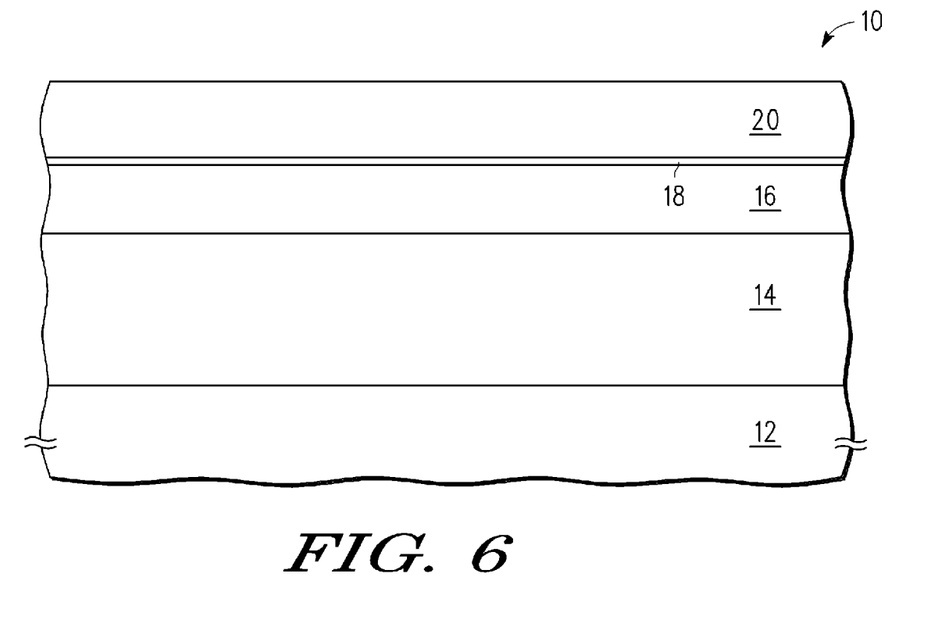
Figure 7:
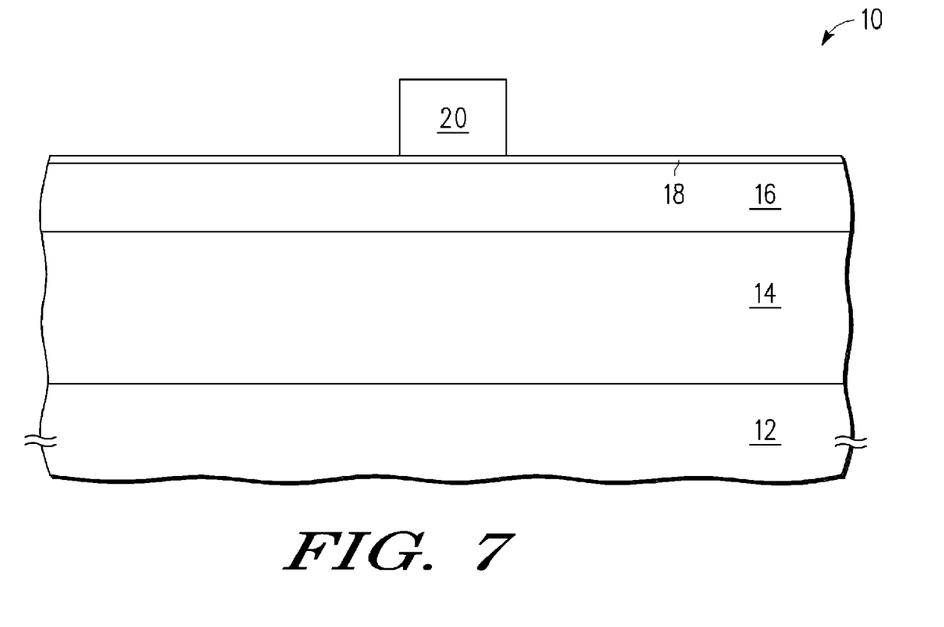

FIGS. 6 and 7 illustrate, in two different cross-sectional views (see FIG. 3 for cut lines), a semiconductor device 10 in accordance with one embodiment of the present invention. In the illustrated embodiment, gate layer 20 has been patterned. In one embodiment, a photoresist mask and subsequent etch are used to produce the patterning. In alternate embodiments, the patterning may be produced using any appropriate technique.

Figure 8:
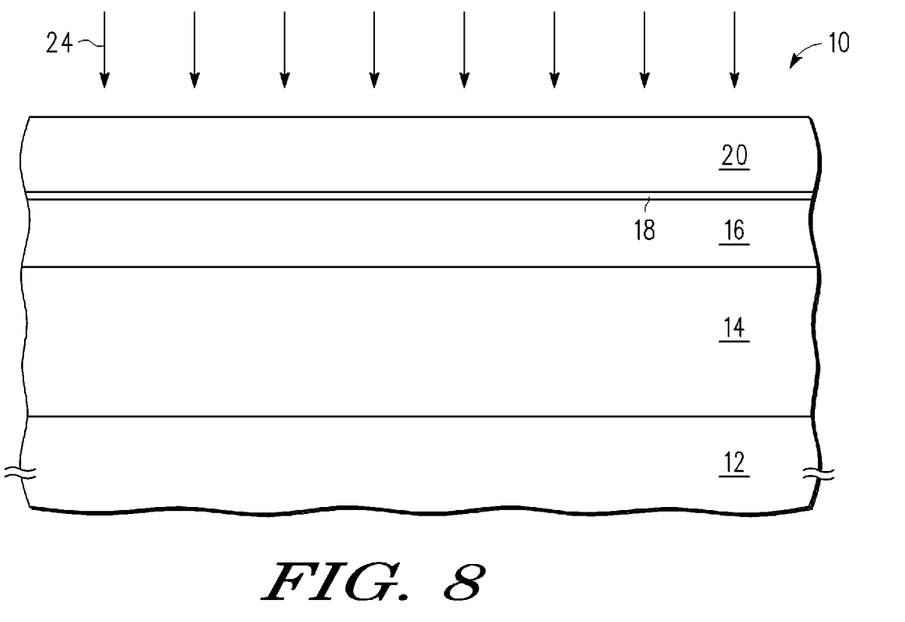
Figure 9:
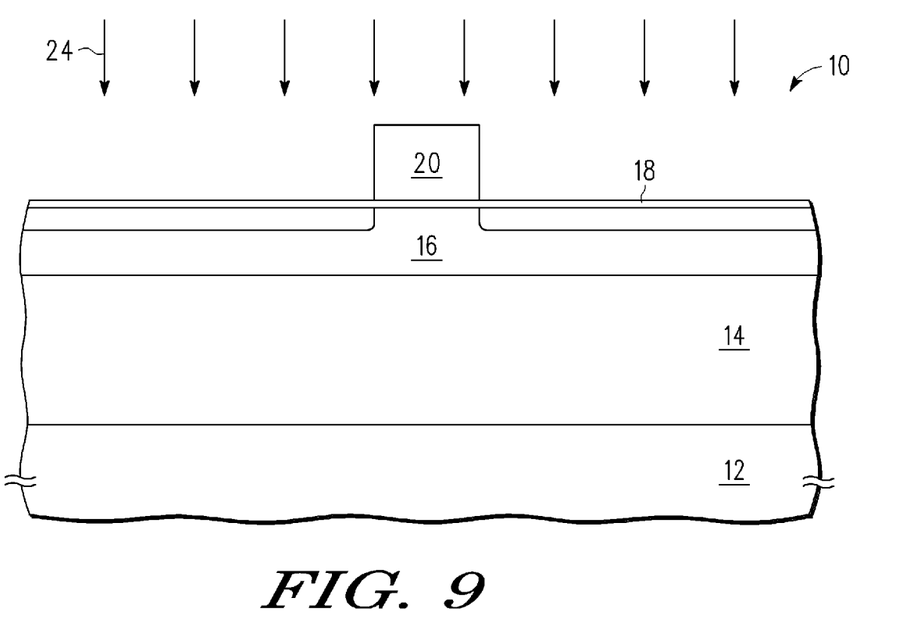

FIGS. 8 and 9 illustrate, in two different cross-sectional views (see FIG. 3 for cut lines), a semiconductor device 10 in accordance with one embodiment of the present invention. In the illustrated embodiment, one or more implant steps (e.g. implant 24) are used to form the source/drain extensions. Note that various known masking techniques may be used to select the areas for implantation. Note also that different implants may be used for different device types (e.g. various p-channel transistors and various n-channel transistors).

Figure 10:
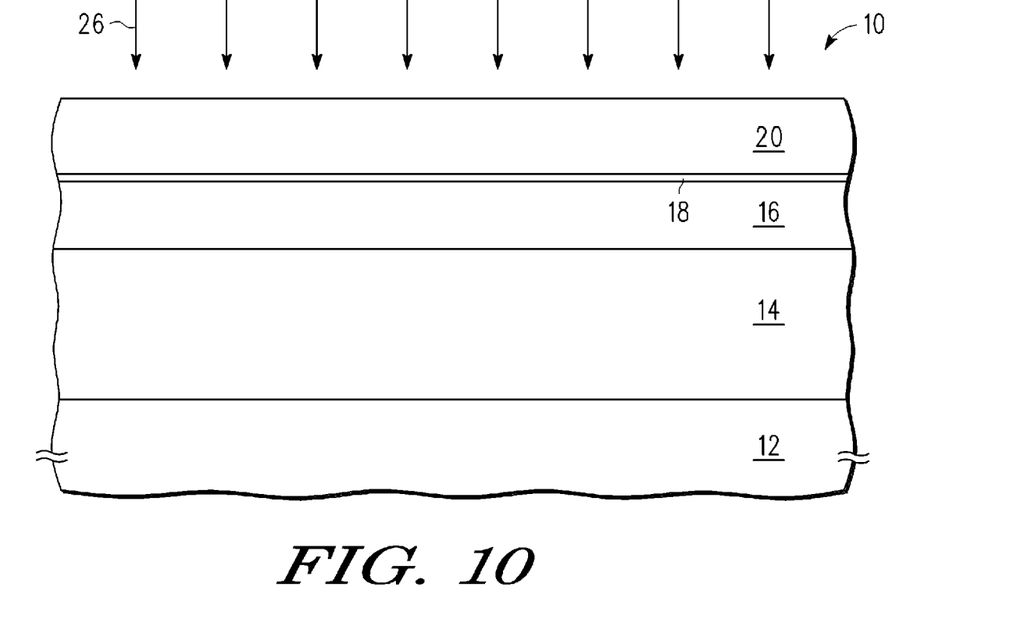
Figure 11:
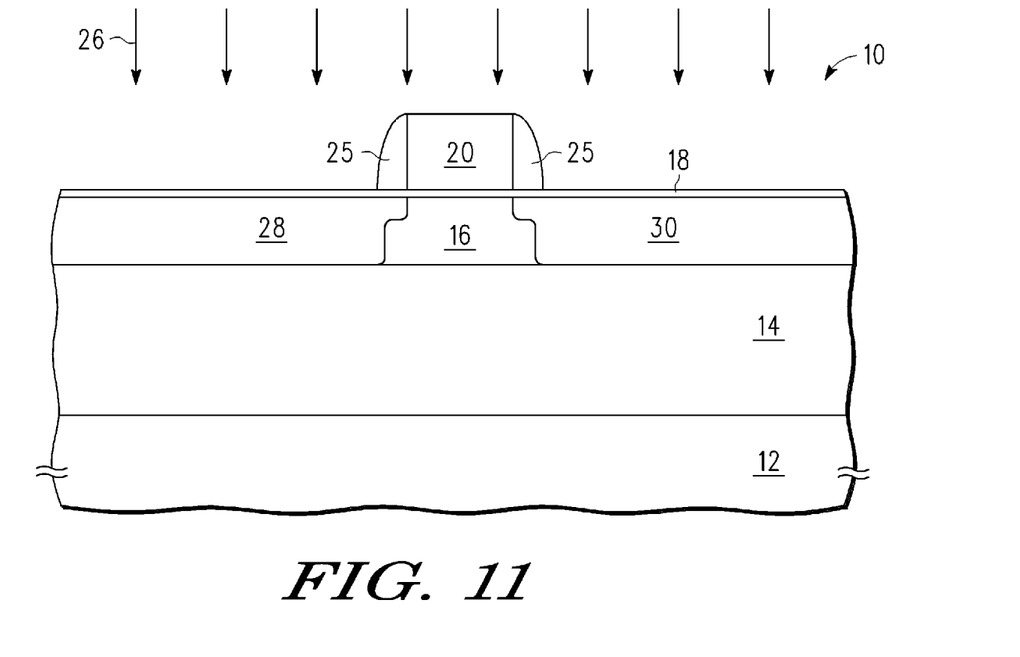

FIGS. 10 and 11 illustrate, in two different cross-sectional views (see FIG. 3 for cut lines), a semiconductor device 10 in accordance with one embodiment of the present invention. Sidewall spacers 25 are formed on the sidewalls of gate 20. In the illustrated embodiment, one or more implant steps (e.g. implant 26) are used to form the source/drain junctions (see source/drain regions 28, 30). Note that various known masking techniques may be used to select the areas for implantation. Note also that different implants may be used for different device types (e.g. various p-channel transistors and various n-channel transistors).

Figure 12:
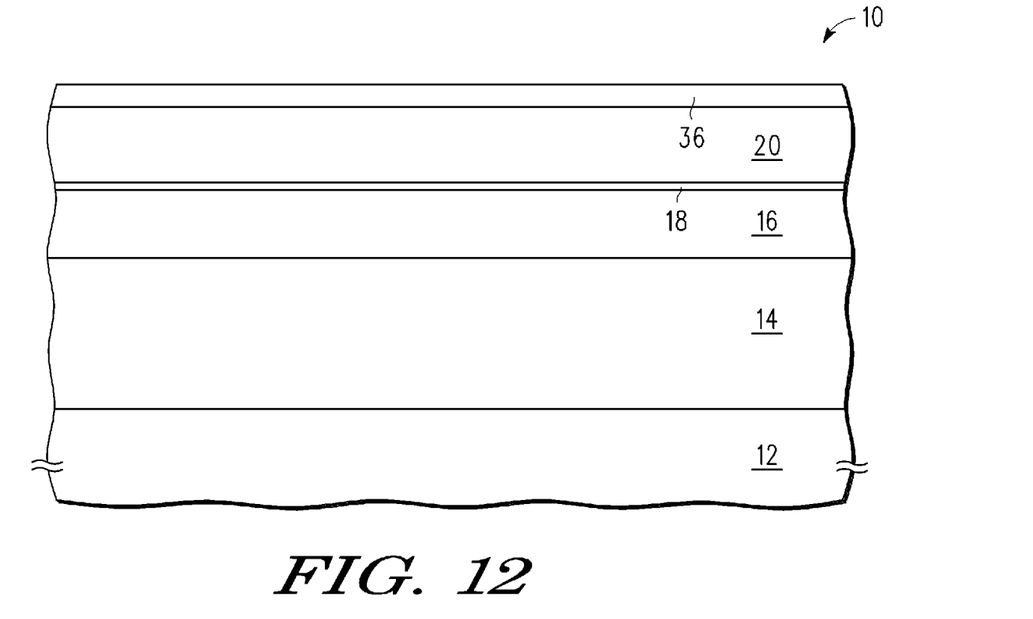
Figure 13:
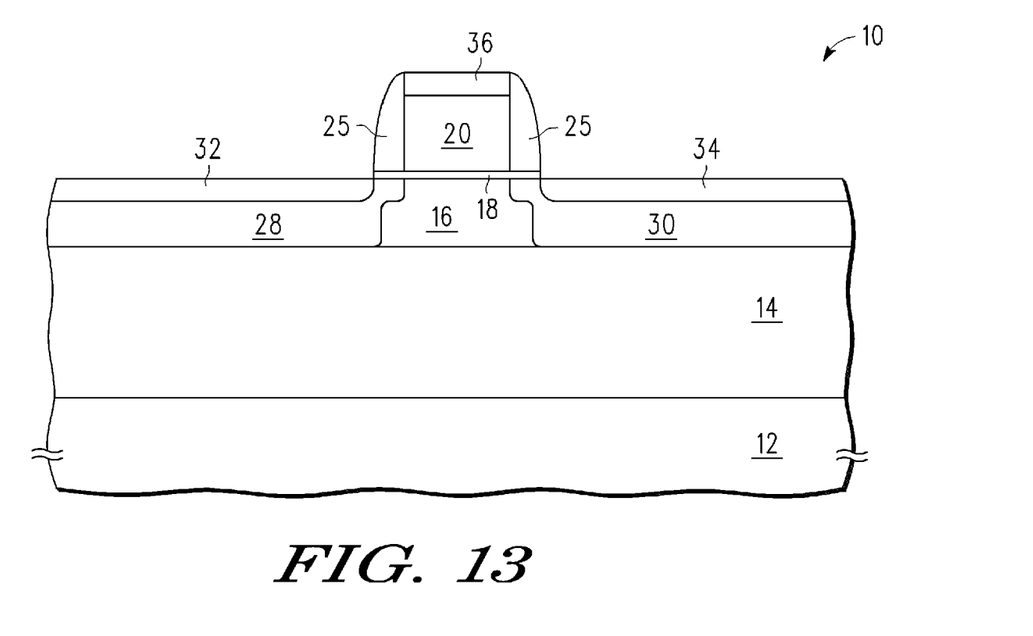
Figure 14:
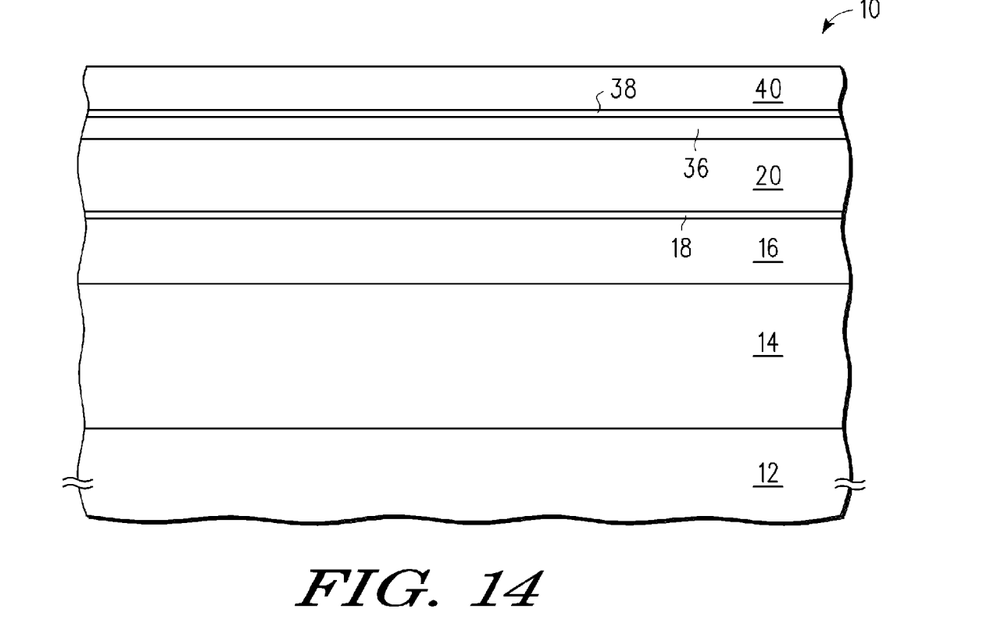
Figure 15:
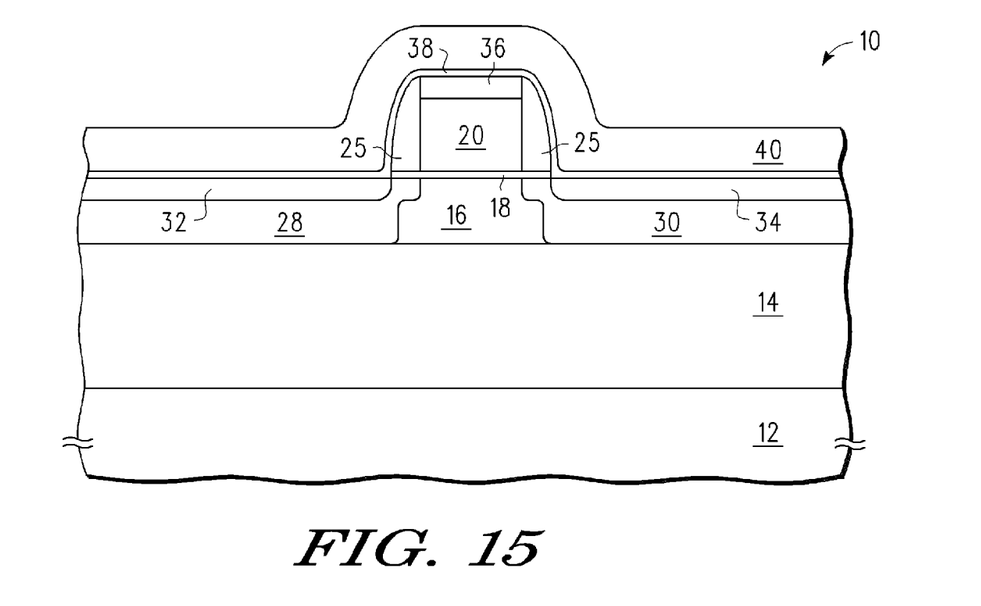

FIGS. 12 and 13 illustrate, in two different cross-sectional views (see FIG. 3 for cut lines), a semiconductor device 10 in accordance with one embodiment of the present invention. A silicide layer 32, 34, 36 is formed overlying the gate layer 20 and the source/drain regions 28, 30.

After the processing illustrated in FIGS. 12 and 13, a variety of choices may be made in processing. In one embodiment, referring to FIG. 24, a nitride layer 41 may be deposited overlying silicide layer 32, 34, 36. In alternate embodiments, the nitride layer 41 may be deposited in multiple steps so that the nitride 41 may be compressive overlying selected areas and may be tensile overlying different areas. In yet other alternate embodiments, an oxide layer (similar to layer 38 in FIG. 15) and a nitride layer (similar to layer 40 in FIG. 15) may be deposited. Next, one or more photolithography and etch steps may be performed to etch trenches in region 47. It is well known to etch through a nitride/oxide/silicon stack for trench isolation. The polysilicon may etch the same as or very similarly to silicon. The silicide layer may be easily etched with slight modifications in chemistry. As one example, in the case of nickel silicide, the addition of CO to the conventional halogen-based trench etch chemistry will allow for the silicide to be properly etched. Other suicides may use similar etch chemistry modifications. Alternate embodiments may use other etches and chemistries that are most applicable to the specific structures and materials in the trench region. Note that alternate embodiments may use any combination of one or more of the following: chemical etch, physical sputter etch, timed etch, endpoint etch, etc.

Figure 24:
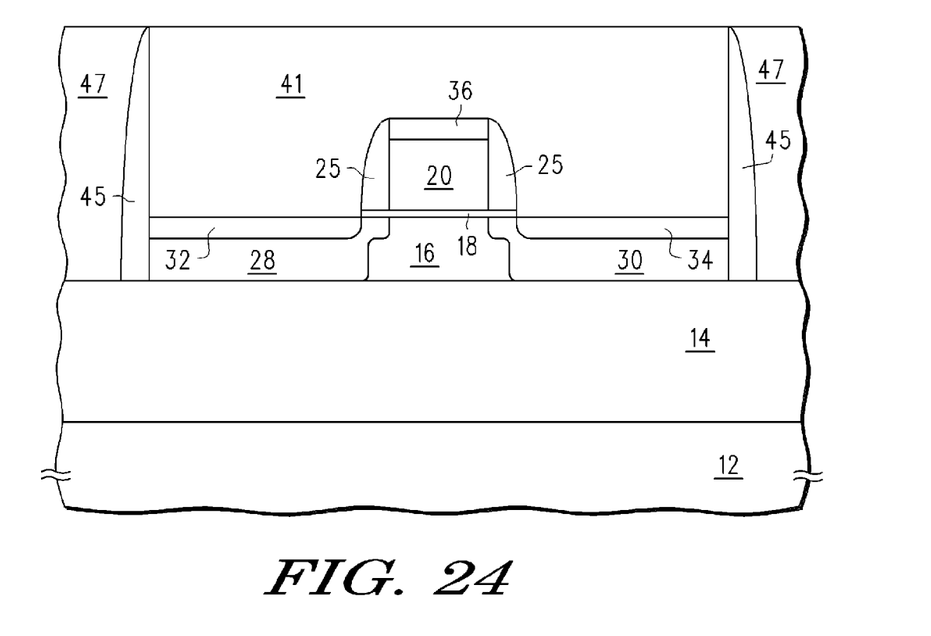

Still referring to FIG. 24, in one embodiment, trench spacers 45 may be formed using known processing techniques. Alternate embodiments may not use trench spacers 45. Field oxide 47 is then deposited in trench region 47. Field oxide 47 may then be planarized using conventional techniques (e.g. chemical mechanical polishing or CMP). Alternate embodiments may planarize in a different manner. In some embodiments, an additional oxide layer (not shown) may be deposited overlying the entire top surface after planarization. In one embodiment, the purpose of this additional oxide layer (not shown) is to provide a dielectric in which a damascene layer may be formed. The etch to form this damascene layer (not shown) may be selective to nitride layer 40 overlying gate 20. A short oxide etch may be used to complete the opening to gate 20, 36.

Figure 25:
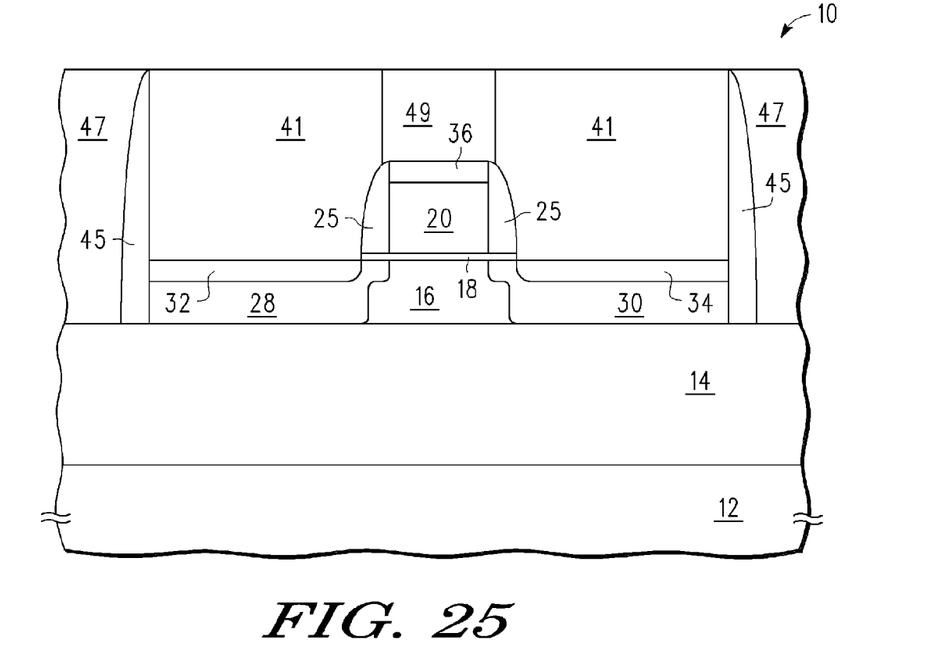

Referring to FIG. 25, one or more photolithography and etch steps may be performed to etch nitride layer 41 in order to make electrical contact to gate 20, 36. Such etches are well known in the art. An interconnect layer 49 comprising one or more conductive materials is then deposited overlying and in electrical contact with gate 20, 36. Note that any excess material 49 which rises above the surface plane of nitride layer 41 may be removed using any appropriate technique (e.g. CMP, plasma etchback). Alternate embodiments may planarize in a different manner.

Referring again to FIGS. 12 and 13, after the processing illustrated in FIGS. 12 and 13, a variety of choices may be made in processing. In an alternate embodiment, referring to FIGS. 14 and 15, an oxide layer 38 is formed overlying the silicide layer 32, 34, 36. A nitride layer 40 is deposited overlying the oxide layer 38.

Figure 16:
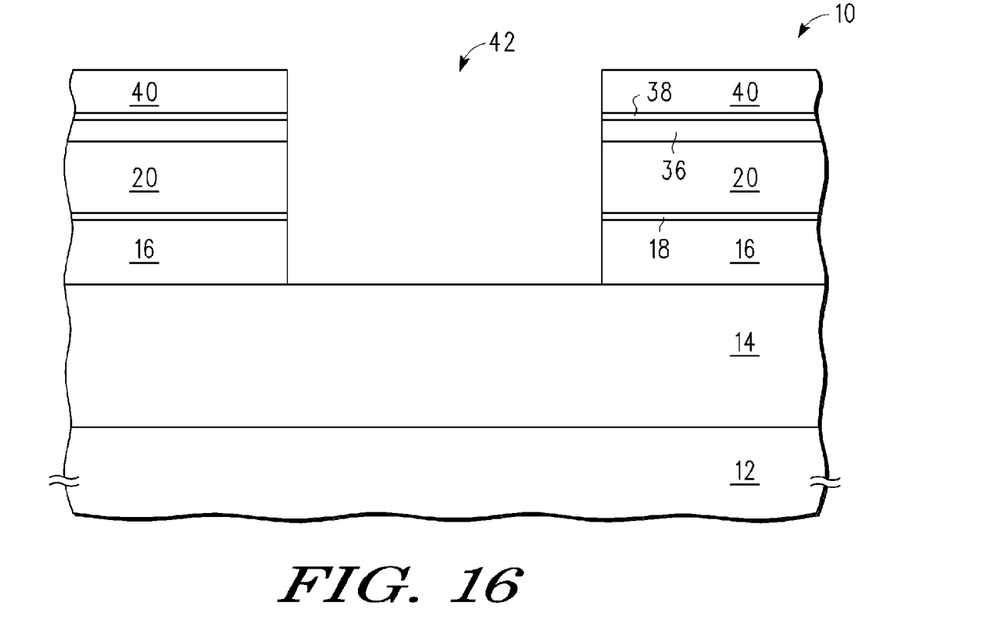
Figure 17:
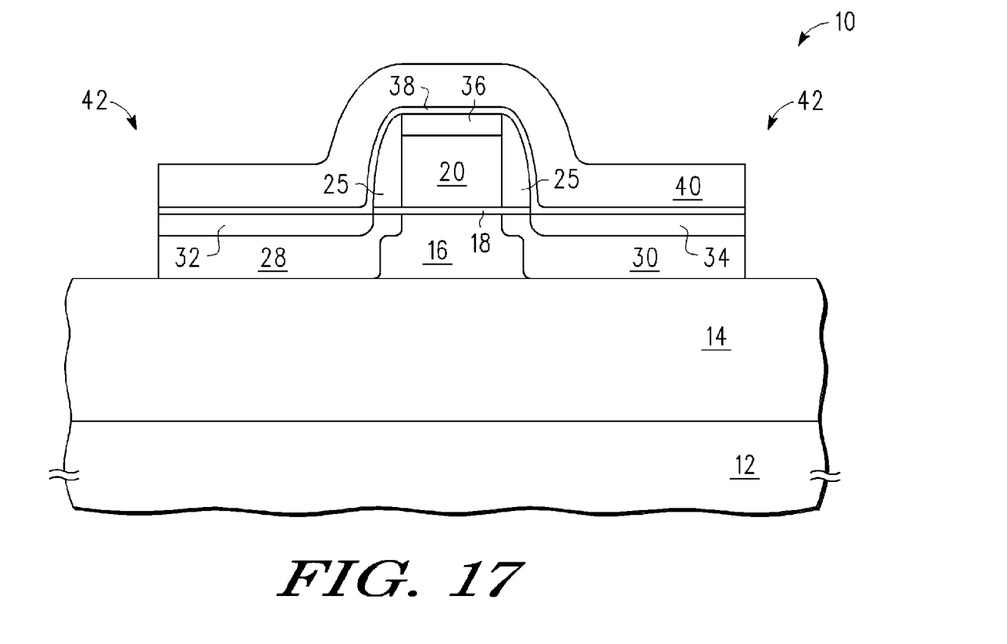

FIGS. 16 and 17 illustrate, in two different cross-sectional views (see FIG. 3 for cut lines), a semiconductor device 10 in accordance with one embodiment of the present invention. One or more photolithography and etch steps may be performed to etch trenches (e.g. 42). It is well known to etch through a nitride/oxide/silicon stack for trench isolation. The polysilicon may etch the same as or very similarly to silicon. The silicide layer may be easily etched with slight modifications in chemistry. As one example, in the case of nickel silicide, the addition of CO to the conventional halogen-based trench etch chemistry will allow for the silicide to be properly etched. Other suicides may use similar etch chemistry modifications. Alternate embodiments may use other etches and chemistries that are most applicable to the specific structures and materials in the trench region. Note that alternate embodiments may use any combination of one or more of the following: chemical etch, physical sputter etch, timed etch, endpoint etch, etc.

Still referring to FIGS. 16 and 17, in one embodiment trench spacers (not shown) may be formed using known processing techniques. Alternate embodiments may not use trench spacers.

Figure 18:
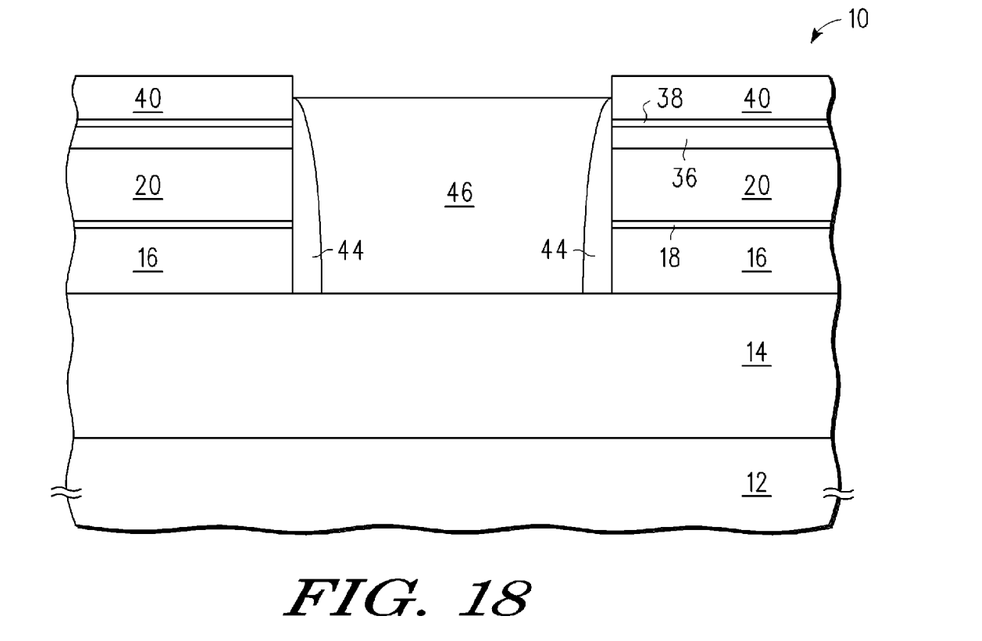
Figure 19:
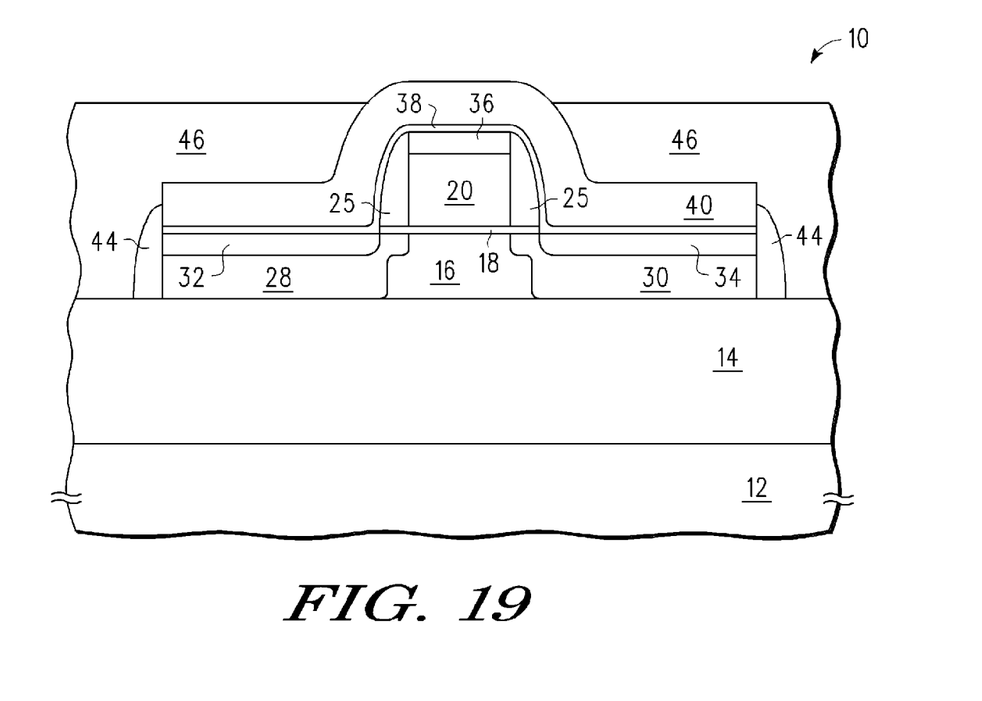

FIGS. 18 and 19 illustrate, in two different cross-sectional views (see FIG. 3 for cut lines), a semiconductor device 10 in accordance with one embodiment of the present invention. Field oxide 46 is deposited in trench 42. Field oxide 46 may then be planarized using conventional techniques (e.g. chemical mechanical polishing or CMP). Alternate embodiments may planarize in a different manner. In one embodiment, the planarization is terminated in the nitride layer 40. In alternate embodiments, the planarization may be terminated in any appropriate location.

Figure 20:
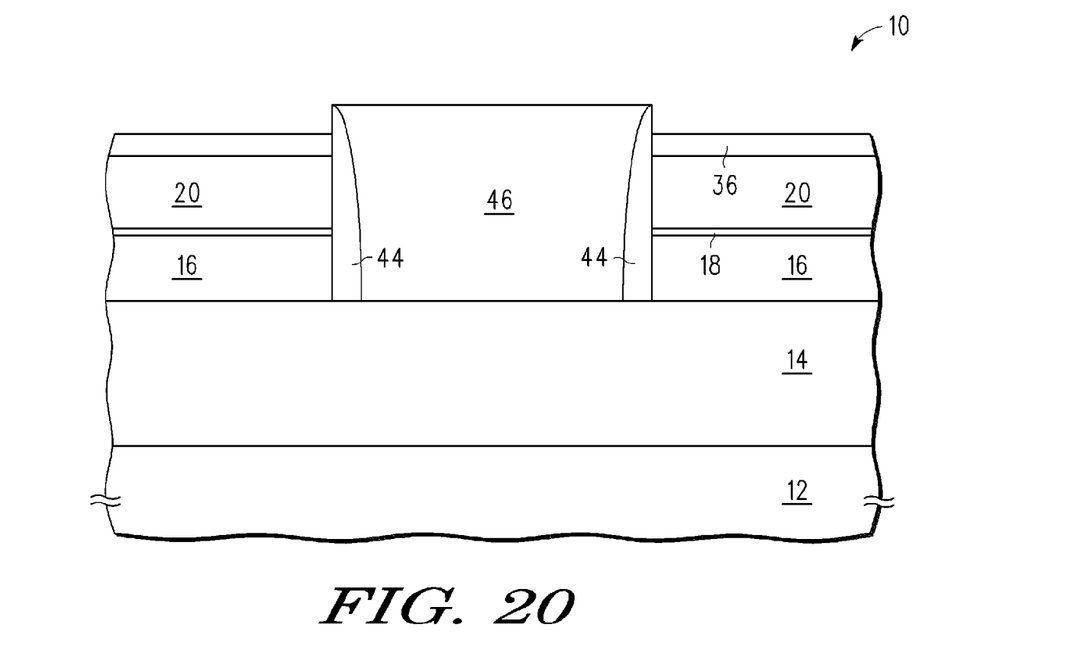
Figure 21:
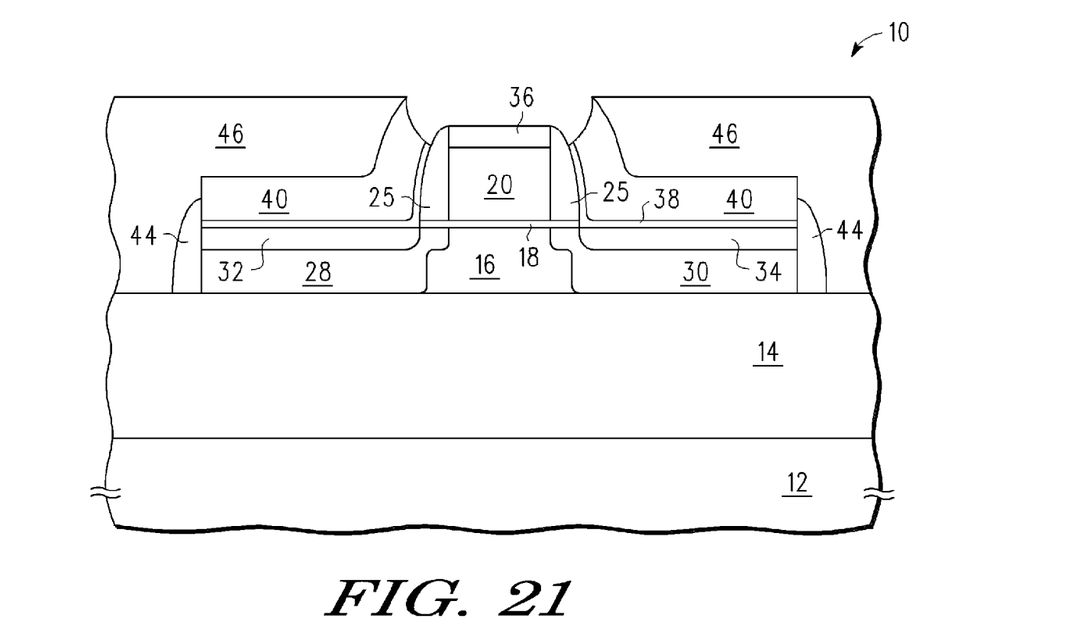

FIGS. 20 and 21 illustrate, in two different cross-sectional views (see FIG. 3 for cut lines), a semiconductor device 10 in accordance with one embodiment of the present invention. Exposed regions of nitride layer 40 are removed using any appropriate etch known in the art (e.g. a dry etch). In addition, oxide layer 38 is removed using any appropriate etch known in the art (e.g. a wet or dry etch). Note that in the illustrated embodiment, the oxide etch may also remove a thin top layer of the thick field oxide 46. Note also that removal of the nitride layer 40 and oxide layer 38 allows electrical contact to be made to gate 20, 36.

Figure 22:
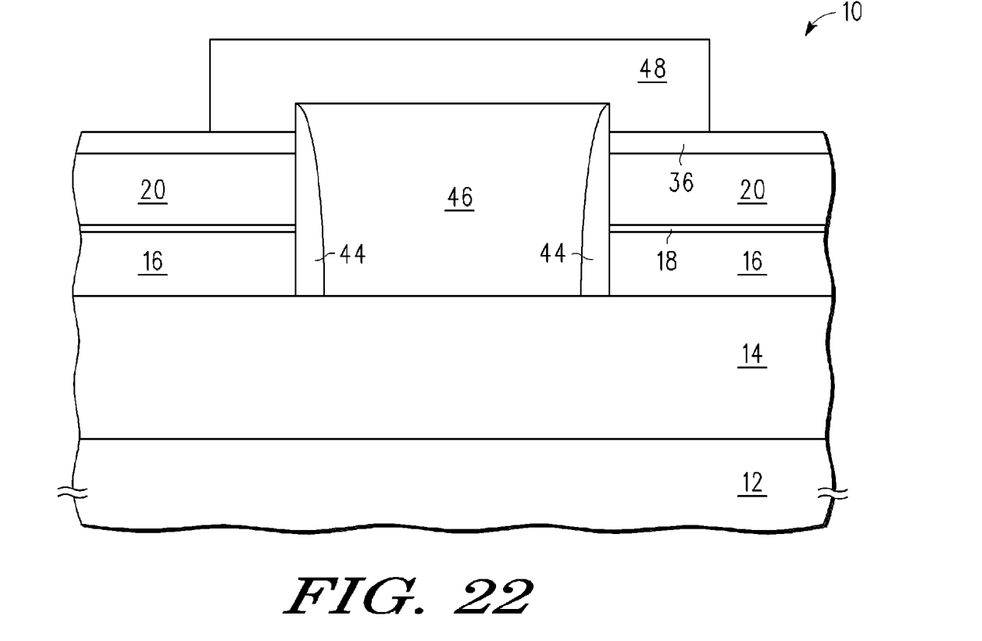
Figure 23:
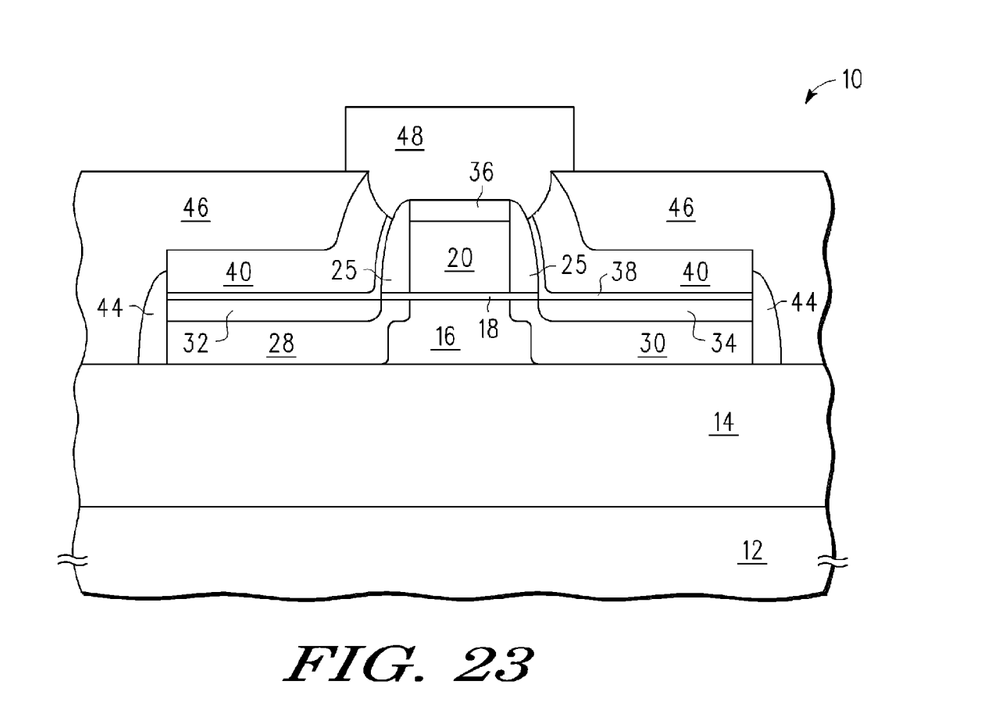

FIGS. 22 and 23 illustrate, in two different cross-sectional views (see FIG. 3 for cut lines), a semiconductor device 10 in accordance with one embodiment of the present invention. An interconnect layer 48 comprising one or more conductive materials is then deposited overlying and in electrical contact with gate 20, 36. Conventional photolithography and etch steps may be performed to pattern the interconnect layer 48. Note that interconnect layer 48 may be used to electrically couple the gates of one or more semiconductor devices (e.g. transistors). After interconnect layer 48 is formed, standard processing may be used to complete the semiconductor device 10. For example, one or more interlevel dielectric layers and/or one or more conductive interconnect layers may be formed.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, although trenches are formed for the purpose of providing trench isolation in the embodiments illustrated herein, alternate embodiments may form one or more trenches for any desired purpose. In addition, trenches may be used in forming any type of semiconductor device, and these semiconductor devices may be used to form any type of circuit. The SRAM circuit 101 illustrated herein is just one possible circuit that may use the present invention. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for forming a semiconductor device on a semiconductor layer, comprising:
   forming a gate dielectric layer over the semiconductor layer;
   forming a layer of gate material over the gate dielectric layer;
   patterning the layer of gate material to form a gate structure;
   implanting into the semiconductor layer using the gate structure as a mask;
   etching through the gate structure to form a first patterned gate structure and through the semiconductor layer to form a trench in the semiconductor layer surrounding a first portion and a second portion of the semiconductor layer and the first patterned gate structure, wherein the step of etching through the gate structure is further characterized by forming a second patterned gate structure wherein the first and second patterned gate structures are separated only by a width of the trench; and
   filling the trench with insulating material.

2. The method of claim 1 further comprising:
   forming a sidewall spacer on a sidewall of the gate structure; and
   implanting into the first portion and the second portion using the gate structure and the sidewall spacer as a mask.

3. The method of claim 1 further comprising electrically connecting a conductive line to the first patterned gate structure.

4. The method of claim 1 further comprising:
   after the step of filling the trench, forming in the semiconductor layer a stressor layer over the first portion, the first patterned gate structure, and the second portion, wherein the stressor layer has a height over the first and second portions that is greater than a height of the first patterned gate structure.

5. The method of claim 1, wherein the step of etching is further characterized by the first patterned gate structure having ends coterminous with the trench in the semiconductor layer, the first portion is on a first side of the first patterned gate structure and the second portion is on a second side of the first patterned gate structure.

6. The method of claim 1, wherein the step of filling the trench comprises:
   forming trench sidewall spacers on sidewalls of the trench; and
   depositing an insulating material in the trench after the step of forming the trench sidewall spacers.

7. The method of claim 3, wherein the step of electrically connecting comprises:
   depositing an insulating layer over a substrate;
   forming a trench in the insulating layer over at least a portion of the gate; and
   filling the trench in the insulating layer with conductive material.

8. The method of claim 3, wherein the step of electrically connecting comprises:
   depositing a metal layer over the first patterned gate structure; and
   patterning the metal layer to leave a portion of the metal layer over the first patterned gate structure.

9. The method of claim 4, wherein the step of forming the stressor is further characterized by the stressor comprising nitride.

10. A method for forming a semiconductor device on a semiconductor layer, comprising:
    forming a gate structure over the semiconductor layer;
    performing an implant using the gate structure as a mask;
    defining an active region in the semiconductor layer, after the step of implanting, by etching through the gate structure and the semiconductor layer to form a trench in the semiconductor layer, wherein the etching results in a first patterned gate structure and a second patterned gate structure in the active region, and wherein first and second patterned gate structures are separated only by a width of the trench; and
    depositing isolation material in the trench.

11. The method of claim 10, wherein the step of defining is further characterized by each of the first patterned gate structure and the second patterned gate structure having two ends in which each end is coterminous with a boundary of the active region defined by the trench.

12. The method of claim 11, wherein the step of forming the gate structure further comprises:
    forming a high k dielectric as a gate dielectric on the semiconductor layer prior to forming the gate structure.

13. The method of claim 11 further comprising:
    after the step of filling the trench, forming a stressor over the active region adjacent to the first patterned gate structure and over the first patterned gate structure; and
    electrically connecting a conductive line to the first patterned gate structure.

14. The method of claim 13, wherein the step of forming the stressor is further characterized by the stressor having a height over active region adjacent to the first patterned gate structure that is above a height of the first patterned gate structure.

15. The method of claim 13 further comprising:
after the step of filling the trench, forming the stressor over the active region adjacent to the second patterned gate structure and over the second patterned gate structure; and
electrically connecting the conductive line to the second patterned gate structure.

16. The method of claim 13, wherein the step of forming the stressor is further characterized by the stressor having a height over active region adjacent to the second patterned gate structure that is above a height of the second patterned gate structure.

17. A method for forming a semiconductor device on a semiconductor layer, comprising:
forming a gate dielectric layer over the semiconductor layer;
forming a layer of gate material over the gate dielectric layer;
patterning the layer of gate material to form a gate structure;
implanting into the semiconductor layer using the gate structure as a mask to form source/drain regions;
forming a silicide layer over the gate structure and the source/drain regions;
after forming the silicide layer, etching through the gate structure, the silicide layer, and the semiconductor layer to form a trench in the semiconductor layer surrounding a first portion and a second portion of the semiconductor layer, wherein the etching results in a first patterned gate structure and a second patterned gate structure separated only by a width of the trench;
filling the trench with insulating material; and
electrically connecting a conductive line to the first patterned gate structure, wherein electrically connecting the conductive line comprises depositing a conductive layer over the first patterned gate structure and the second patterned gate structure and patterning the conductive layer to leave a portion of the conductive layer over the first patterned gate structure and the second patterned gate structure to interconnect the first patterned gate structure and the second patterned gate structure.

18. The method of claim 17 further comprising:
after forming the silicide layer over the gate structure and the source/drain regions, forming a nitride layer over the silicide layer.

19. The method of claim 18 further comprising:
prior to filling the trench with the insulating material, forming trench sidewall spacers in the trench.

* * * * *